(12) United States Patent
Kim

(10) Patent No.: US 8,610,349 B2
(45) Date of Patent: Dec. 17, 2013

(54) ORGANIC LIGHT EMITTING DIODE DISPLAY

(75) Inventor: Min-Cheol Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 350 days.

(21) Appl. No.: 12/916,393

(22) Filed: Oct. 29, 2010

(65) Prior Publication Data
US 2011/0193478 A1    Aug. 11, 2011

(30) Foreign Application Priority Data

Feb. 8, 2010    (KR) .................. 10-2010-0011503

(51) Int. Cl.
H01J 1/62    (2006.01)
H05B 33/04    (2006.01)

(52) U.S. Cl.
USPC .......................................... 313/512; 313/498

(58) Field of Classification Search
USPC .................................................. 313/512, 498
See application file for complete search history.

(56) References Cited

U.S. PATENT DOCUMENTS

| 2003/0017320 A1* | 1/2003 | Ebihara et al. | 428/306.6 |
| 2006/0050221 A1* | 3/2006 | Kim et al. | 349/149 |
| 2008/0012485 A1* | 1/2008 | Nam | 313/512 |
| 2009/0135095 A1* | 5/2009 | Kawada | 345/60 |

FOREIGN PATENT DOCUMENTS

| JP | 2003-216054 (A) | 7/2003 |
| JP | 2008-204966 | 9/2008 |
| KR | 10-2001-0098816 (A) | 11/2001 |
| KR | 10-2006-0061167 (A) | 6/2006 |
| KR | 10-0765262 | 10/2007 |
| KR | 10-2008-0041121 (A) | 5/2008 |
| KR | 20-2009-0000113 | 1/2009 |

OTHER PUBLICATIONS

Korean Office Action dated Apr. 13, 2011 for Korean Patent Application No. KR 10-2010-0011503 which corresponds to captioned U.S. Appl. No. 12/916,393.

Korean Notice of Allowance dated Dec. 27, 2011 for Korean Patent Application No. KR 10-2010-0011503 which corresponds to captioned U.S. Appl. No. 12/916,393.

* cited by examiner

*Primary Examiner* — Anh Mai
*Assistant Examiner* — Andrew Coughlin
(74) *Attorney, Agent, or Firm* — Knobbe Martens Olson & Bear LLP

(57) ABSTRACT

An organic light emitting diode (OLED) display is disclosed. In one embodiment, the OLED display includes: an organic light emitting display panel including i) a base substrate having a pixel area and a pad area and ii) a protection substrate connected to the base substrate to cover the pixel area, wherein the pad area is formed outside of the pixel area and adjacent to an edge of the base substrate. The OLED display also includes a printed circuit board formed on the protection substrate and a chip on film including i) a first terminal electrically connected to the pad area, ii) a second terminal electrically connected to the printed circuit board and iii) a bending portion bent from the first terminal toward the second terminal. The OLED display further includes a spacer formed on the first terminal, wherein the spacer is located inside of the bending portion.

17 Claims, 5 Drawing Sheets

ORGANIC LIGHT EMITTING DIODE DISPLAY

RELATED APPLICATIONS

This application claims priority to and the benefit of Korean Patent Application No. 10-2010-0011503 filed in the Korean Intellectual Property Office on Feb. 8, 2010, the entire contents of which are incorporated herein by reference.

BACKGROUND

1. Field

The described technology generally relates to an organic light emitting diode (OLED) display.

2. Description of the Related Technology

An OLED display is self-emissive and thus it can display an image without the use of a backlight unit. In OLEDs, light is emitted by energy generated when excitons, formed when electrons and holes are combined, drop from an excited state to a ground state, and an image is displayed by using the light.

SUMMARY

One aspect is an organic light emitting diode display that can increase the attachment force of a chip on film to a base substrate, prevents a short-circuit of the chip on film by suppressing damage to the chip on film caused by an external force, and increase the heat dissipation characteristics of a driving integrated circuit.

Another aspect is an organic light emitting diode display, including: i) an organic light emitting display panel including a base substrate having a pixel area and a pad area, and a protection substrate fixed to the base substrate to cover the pixel area; ii) a printed circuit board located outside of the protection substrate; iii) a chip on film including a first terminal fixed to the pad area, a bending portion bent from the first terminal toward the outside of the protection substrate, and a second terminal fixed to the printed circuit board; and iv) a spacer located on the first terminal inside of the bending portion.

The chip on film may further include a flat portion located between the bending portion and the second terminal, and the spacer may be located between the first terminal and the flat portion. The chip on film may further include a driving integrated circuit that is fixed to the inside of the flat portion facing the spacer and closely contacted with the spacer.

The sum of the thicknesses of the first terminal, the spacer, and the driving integrated circuit may be equal to the sum of the thicknesses of the protection substrate and the printed circuit board. The thickness of the spacer may be equal to the thickness of the protection substrate, and the width of the spacer may be equal to or greater than the width of an overlap area of the chip on film and the spacer.

The spacer may include a thermal conductive layer and an adhesive layer formed on one surface of the thermal conductive layer facing the first terminal and on another surface of the thermal conductive layer facing the flat portion.

The thermal conductive layer may have thermal conductivity of greater than about 0.7 W/(mk), and may include any one of a silicon resin, a ceramic, a metal, a metal oxide, and a metal hydride. The metal may include any one of aluminum, copper, or an aluminum-copper alloy. The adhesive layer may include a thermally conductivity acrylic adhesive.

The organic light emitting display panel may include organic light emitting elements formed in the pixel area, and each of the organic light emitting elements may include a transmissive pixel electrode, an organic emission layer formed on the pixel electrode, and a reflective common electrode formed on the organic emission layer. Another aspect is an organic light emitting diode display, comprising: an organic light emitting display panel including i) a base substrate having a pixel area and a pad area and ii) a protection substrate connected to the base substrate to cover the pixel area, wherein the pad area is formed outside of the pixel area and adjacent to an edge of the base substrate; a printed circuit board formed on the protection substrate; a chip on film including i) a first terminal electrically connected to the pad area, ii) a second terminal electrically connected to the printed circuit board and iii) a bending portion bent from the first terminal toward the second terminal; and a spacer formed on the first terminal, wherein the spacer is located inside of the bending portion.

In the above display, the chip on film further comprises a flat portion interconnecting the bending portion and the second terminal, and wherein the spacer is located between the first terminal and the flat portion. In the above display, the spacer includes a top surface and a bottom surface opposing each other, wherein the bottom surface is connected to the first terminal, and wherein the chip on film further comprises a driving integrated circuit interposed between the flat portion and the top surface of the spacer.

In the above display, the sum of the thicknesses of the first terminal, the spacer, and the driving integrated circuit is substantially equal to the sum of the thicknesses of the protection substrate and the printed circuit board. In the above display, the spacer comprises a thermal conductive layer and an adhesive layer formed on one surface of the thermal conductive layer facing the first terminal and on another surface of the thermal conductive layer facing the flat portion.

In the above display, the thermal conductive layer has thermal conductivity of greater than about 0.7 W/(mk), and is formed of at least one of the following: a silicon resin, a ceramic, a metal, a metal oxide, and a metal hydride. In the above display, the metal is formed of at least one of the following: aluminum, copper, or an aluminum-copper alloy. In the above display, the adhesive layer is formed of a thermally conductivity acrylic adhesive.

In the above display, the thickness of the spacer is substantially equal to the thickness of the protection substrate, and wherein the width of the spacer is greater than or equal to the width of an overlap area of the chip on film and the spacer. In the above display, the organic light emitting display panel comprises organic light emitting elements formed in the pixel area, and wherein each of the organic light emitting elements comprises a transmissive pixel electrode, an organic emission layer formed on the pixel electrode, and a reflective common electrode formed on the organic emission layer. In the above display, the spacer includes two opposing side surfaces, wherein one side surface faces the bending portion, and wherein the other side surface faces a side surface of the protection substrate.

In the above display, the protection substrate includes a top surface and a bottom surface opposing each other, wherein the printed circuit board is formed on the top surface of the protection substrate, wherein the bottom surface of the protection substrate is connected to the base substrate via a sealant, and wherein the side surface of the protection substrate is substantially perpendicular to at least one of the top and bottom surfaces of the protection substrate.

Another aspect is an organic light emitting diode display, comprising: a base substrate having a pixel area and a pad area, wherein the pad area is formed outside of the pixel area and adjacent to an edge of the base substrate; a protection substrate connected to the base substrate to cover the pixel area, wherein the protection substrate does not contact at least part of the pad area; a printed circuit board formed on the protection substrate; a chip on film including i) a first terminal electrically connected to the pad area, ii) a second terminal electrically connected to the printed circuit board, iii) a bending portion bent from the first terminal toward the second terminal and iv) a flat portion interconnecting the bending portion and the second terminal; and a spacer formed on the first terminal, wherein the spacer is located inside of the bending portion.

In the above display, the spacer contacts neither of the bending portion and the protection substrate. In the above display, the spacer includes a top surface and a bottom surface opposing each other, wherein the bottom surface is connected to the first terminal, and wherein the chip on film further comprises a driving integrated circuit interposed between the flat portion and the top surface of the spacer. In the above display, the spacer is wider and thicker than the driving integrated circuit.

In the above display, the spacer comprises a thermal conductive layer and an adhesive layer formed on one surface of the thermal conductive layer facing the first terminal and on another surface of the thermal conductive layer facing the flat portion. In the above display, the thermal conductive layer is substantially thicker than the adhesive layer.

Another aspect is an organic light emitting diode display, comprising: a first substrate having a pixel area and a pad area, wherein the pad area is formed outside of the pixel area; a second substrate connected to the pixel area of the first substrate, wherein the second substrate has a top surface and a bottom surface opposing each other, and wherein the bottom surface contacts the pixel area; a printed circuit board formed on the top surface of the second substrate; a first terminal having first and second surfaces opposing each other, wherein the first surface of the first terminal is electrically connected to the pad area; a second terminal electrically connected to the printed circuit board; a non-linear portion non-linearly extending from the first terminal toward the second terminal; a flat portion interconnecting the non-linear portion and second terminal, wherein the flat portion has first and second surfaces opposing each other, and wherein the first surface of the flat portion faces the first terminal and is substantially directly above the pad area; a driving integrated circuit formed on the first surface of the flat portion; and a spacer contacting the second surface of the first terminal and the driving integrated circuit, wherein the spacer comprises i) a thermal conductive layer, ii) a first adhesive layer formed on a first surface of the thermal conductive layer and iii) a second adhesive layer formed on a second surface of the thermal conductive layer, wherein the first adhesive layer contacts the first terminal, and wherein the second adhesive layer contacts the driving integrated circuit.

In the above display, the width of the spacer is substantially equal to the width of the first terminal and the flat portion, and wherein the spacer is thicker and wider than the driving integrated circuit.

DETAILED DESCRIPTION

Figure 1A:
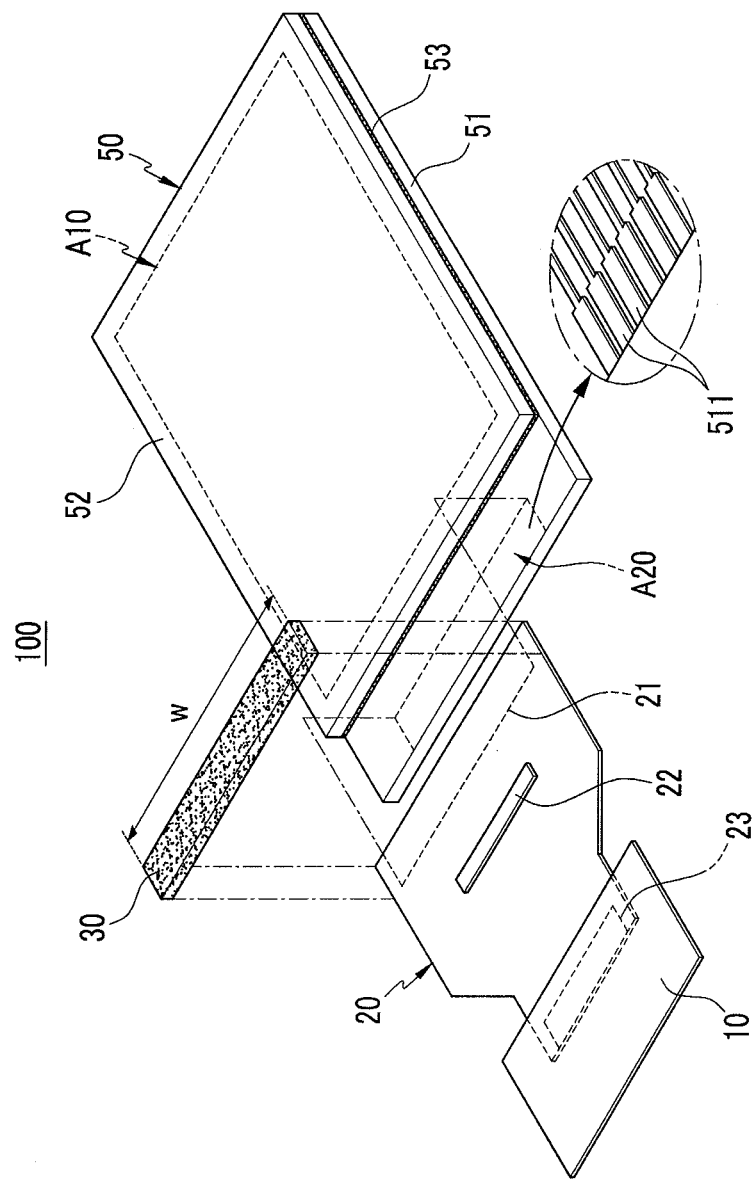
FIG. 1A is an exploded perspective view of an organic light emitting diode display according to one exemplary embodiment.

An organic light emitting diode (OLED) display includes thin film transistors and organic light emitting elements which are formed in a pixel area of a base substrate. The thin film transistors and the organic light emitting elements are generally covered with a protection substrate. A first terminal of a chip on film is fixed to a pad area of the base substrate, and a second terminal of the chip on film is fixed to a printed circuit board.

In a bottom emission type OLED display, the light emitted from the organic light emitting elements passes through the thin film transistors and the base substrate to display an image. Thus, the base substrate becomes a front substrate through which an image is displayed, and the protection substrate becomes a rear substrate. The chip on film includes a bending portion which is bent in a substantially "C" shape toward a rear surface of the protection substrate, and the printed circuit board is positioned on the rear surface of the protection substrate.

The first terminal of the chip on film receives a continuous force in the direction in which the chip on film is bent, and hence the attachment force to the base substrate is reduced. Also, the aforementioned structure has no reinforcing means capable of resisting the external force applied to the chip on film and a driving integrated circuit mounted thereon, and the chip on film is damaged by the external force, so that an internal circuit of the chip on film may be short-circuited.

Moreover, a large amount of heat is generated from the driving integrated circuit during operation of the OLED display. Thus, there is a demand for structural improvement in order to increase the heat dissipation characteristics of the driving integrated circuit.

Exemplary embodiments will be described more fully hereinafter with reference to the accompanying drawings. As those skilled in the art would realize, the described embodiments may be modified in various different ways.

In the drawings, the sizes and thicknesses of the components are merely shown for convenience of explanation and are not considered limiting. Throughout the specification, it will be understood that when an element such as a layer, film, region, or substrate is referred to as being "on" another element, it can be directly on the other element or intervening elements may also be present.

Figure 1B:
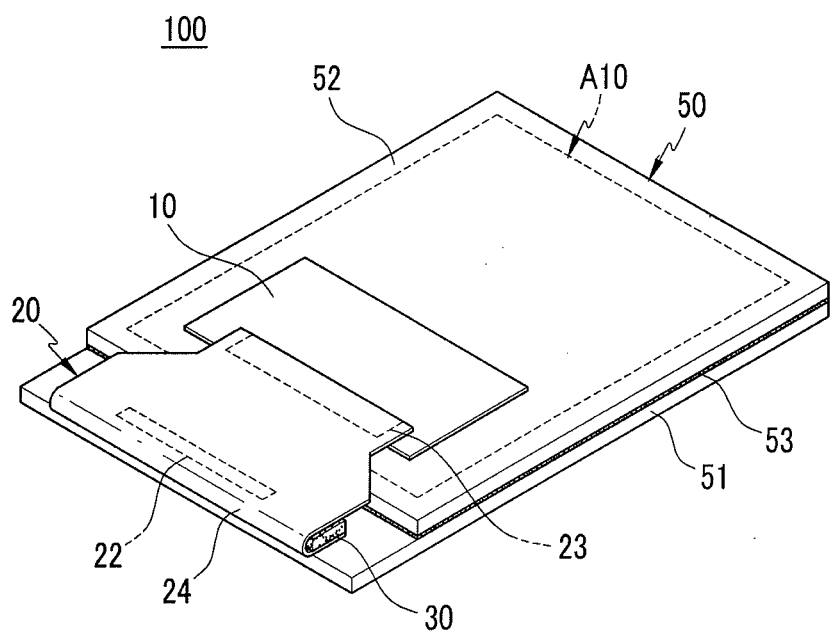
FIG. 1B is an assembled perspective view of an organic light emitting diode display according to one exemplary embodiment.
Figure 2:
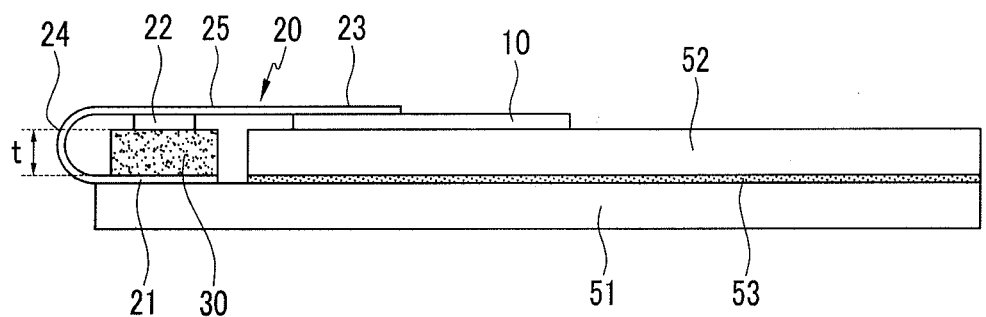
FIG. 2 is a side view of the organic light emitting diode display shown in FIG. 1B.

FIGS. 1A and 1B are an exploded perspective view and an assembled perspective view of an OLED display according to one exemplary embodiment, and FIG. 2 is a side view of the OLED display shown in FIG. 1B.

Referring to FIGS. 1A, 1B, and 2, the OLED display 100 includes an organic light emitting display panel 50, a printed circuit board 10, a chip on film 20, and a spacer 30.

The organic light emitting display panel 50 includes a base substrate (or a first substrate) 51 having a pixel area A10 and a pad area A20, and a protection substrate (or a second substrate) 52 fixed to the base substrate 51 so as to cover the pixel area A10. The pixel area A10 is configured to display an image. The pad area A20 does not display an image and instead is used for, for example, electrical connection between the panel 50 and driving circuitry. In one embodiment, the protection substrate 52 has a smaller size than that of the base substrate 51, and is fixed to the base substrate 51 by, for example, a sealant 53 surrounding the pixel area A10 to cover and protect pixels formed in the pixel area A10.

A plurality of gate lines (scan lines) and a plurality of data lines cross each other in the pixel area A10 of the base substrate 51, and pixels including thin film transistors and organic light emitting elements are formed at the crossing points of the gate lines and the data lines. Each pixel is selected when a scan signal is supplied to the gate lines, and the selected pixel emits light with luminance corresponding to the data signal supplied to the data lines.

Pad electrodes 511 are located in the pad area A20 of the base substrate 51.

The pad electrodes 511 include electrodes extending from the gate electrodes of the pixel area A10, electrodes extending from the data lines of the pixel area A10, a power supply line, etc. The pad electrodes 511 are electrically connected to a first terminal 21 of the chip on film 20 to transmit a driving signal generated from a driving integrated circuit 22 of the chip on film 20 to the gate lines and data lines of the pixel area A10. In one embodiment, the spacer 30 may be substantially wider and thicker than the driving integrated circuit 22.

The chip on film 20 is a type of tape carrier package TCP in which the driving integrated circuit 22 is mounted on a chip form on a film. The chip on film 20 includes the first terminal 21 fixed to the pad area A20 and a second terminal 23 fixed to the printed circuit board 10. In one embodiment, the first terminal 21 is an output terminal of the chip on film 20, and the second terminal 23 is an input terminal of the chip on film 20. The driving integrated circuit 22 is electrically connected to internal electrodes of the chip on film 20 that electrically connect the first terminal 21 and the second terminal.

The driving integrated circuit 22 generates scan signals and data signals in response to driving power and signals provided through the printed circuit board 10, and outputs them to the first terminal 21. As a result, the scan signals and the data signals are supplied to the gate lines and data lines of the pixel area A10 through the pad electrodes 511. The driving integrated circuit 22 includes a scan driver for generating the scan signals and a data driver for generating the data signals.

In one embodiment, the OLED display 100 is a bottom emission type OLED display that uses the light emitted from the organic light emitting elements and passing through the thin film transistors and the base substrate 51. Therefore, from an observer's viewpoint, the base substrate 51 becomes a front substrate and the protection substrate 52 becomes a rear substrate.

The base substrate 51 may be made of a transparent insulating material such as glass, quartz, or ceramic, or may be made of a transparent flexible material such as plastic or a polymer film. The protection substrate 52 may be made of a transparent insulating material such as glass, quartz, ceramic, or plastic, or may be made of an opaque metal. Moreover, the protection substrate 52 may have a thin film structure including at least one of an insulation organic film and an insulation inorganic film laminated thereon.

The printed circuit board 10 is disposed in close contact with an outer surface (or a top surface) of the protection substrate 52 so as not to block the display screen. In one embodiment, the chip on film 20 includes a bending portion (or a non-linear portion) 24 bent from the first terminal 21 toward the outside of the protection substrate 52 and a flat portion 25 located between the bending portion 24 and the second terminal 23. In one embodiment, the non-linear portion may be curved. For example, when viewing the OLED display 100 from a side, the chip on film 20 is kept bent in a substantially C shape. In another embodiment, the non-linear portion may non-linearly extend toward the flat portion 25 or the second terminal 23. Here, the "non-linear" shape may include a curved shape and a non-curved shape (for example, a "<" shape).

The spacer 30 is located on the first terminal 21 inside of the bending portion 24. That is, the spacer 30 is located inside of the bending portion 24 at a predetermined distance from the bending portion 24, and is fixed between the first terminal 21 and the flat portion 25 along the thickness direction of the OLED display 100. Thus, the first terminal 21 and flat portion 25 of the chip on film 20 can be spaced apart by a constant distance corresponding to the thickness of the spacer 30 by the spacer 30. The driving integrated circuit 22 of the chip on film 20 is located inside of the flat portion 25 facing the spacer 30, and closely contacts the spacer 30.

As the spacer 30 presses the first terminal 21 from above the first terminal 21, the attachment force of the first terminal 21 to the base substrate 51 can be increased by the pressure of the spacer 30. Moreover, since the spacer 30 fills the space between the first terminal 21 and the driving integrated circuit 22, when an external force is applied to the chip on film 20, the spacer 30 functions as a reinforcing means for resisting the external force.

More specifically, the thickness t (see FIG. 2) of the spacer 30 may be substantially equal to the thickness of the protection substrate 52, and the sum of the thicknesses of the first terminal 21, the spacer 30, and the driving integrated circuit 22 may be substantially equal to the sum of the thicknesses of the protection substrate 52 and the printed circuit board 10. Moreover, the width w (see FIG. 1A) of the spacer 30 may be greater than or equal to the width of an overlap area of the chip on film 20 and the spacer 30. FIGS. 1A and 1B illustrate, as an example, the case where the width of the spacer 30 is substantially equal to the width of the first terminal 21 and the flat portion 25 of the chip on film 20.

In one embodiment, the flat portion 25 of the chip on film 20 is not projected or depressed, but maintains substantially the same height as the second terminal 23, and as such, no abruptly bent portion is produced when an external force is applied to the chip on film 20. As a result, the OLED display 100 can effectively suppress damage to the chip on film 20 and a possible short-circuit of the internal circuit of the chip on film 20.

Figure 3:
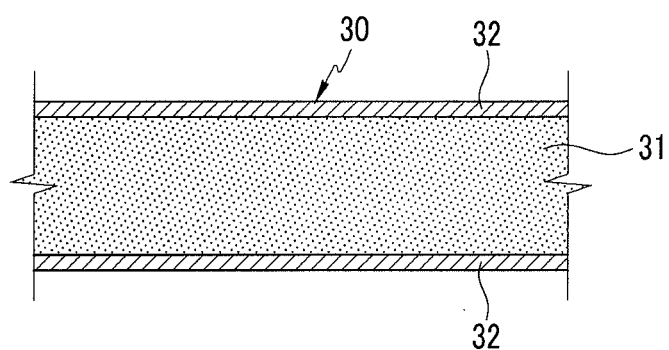
FIG. 3 is a partial enlarged cross-sectional view of a spacer of the organic light emitting diode display shown in FIG. 2.

FIG. 3 is a partial enlarged cross-sectional view of the spacer of the OLED display shown in FIG. 2.

Referring to FIGS. 2 and 3, the spacer 30 includes a thermal conductive layer 31 and an adhesive layer 32 formed on one surface of the thermal conductive layer 31 facing the first terminal 21 and on another surface of the thermal conductive layer 31 facing the flat portion 25. The upper adhesive layer 32 may be a first adhesive layer and the lower adhesive layer 32 may be a second adhesive layer. In one embodiment, as shown in FIG. 3, the thickness of the thermal conductive layer 31 is greater than the thickness of the adhesive layer 32.

The thermal conductive layer 31 may be made of a material having thermal conductivity of greater than about 0.7 W/(mk), for example, at least one of a silicon resin, a ceramic, a metal, a metal oxide, and a metal hydride. The metal may be aluminum, copper, or an aluminum-copper alloy. These metals exhibit much higher thermal conductivity than a silicon resin and a ceramic. The adhesive layer 32 may be made of a thermally conductive acrylic adhesive.

As the spacer 30 is made of a material having high thermal conductivity, the heat generated from the driving integrated circuit 22 is transmitted to the thermal conductive layer 31 and then rapidly emitted out of the spacer 30. Therefore, even if a large amount of heat is generated from the driving integrated circuit 22 during a driving process of the OLED display 100, the heat can be rapidly emitted out through the spacer 30, thereby suppressing overheating of the driving integrated circuit 22 and, accordingly, preventing defect generation.

Figure 4:
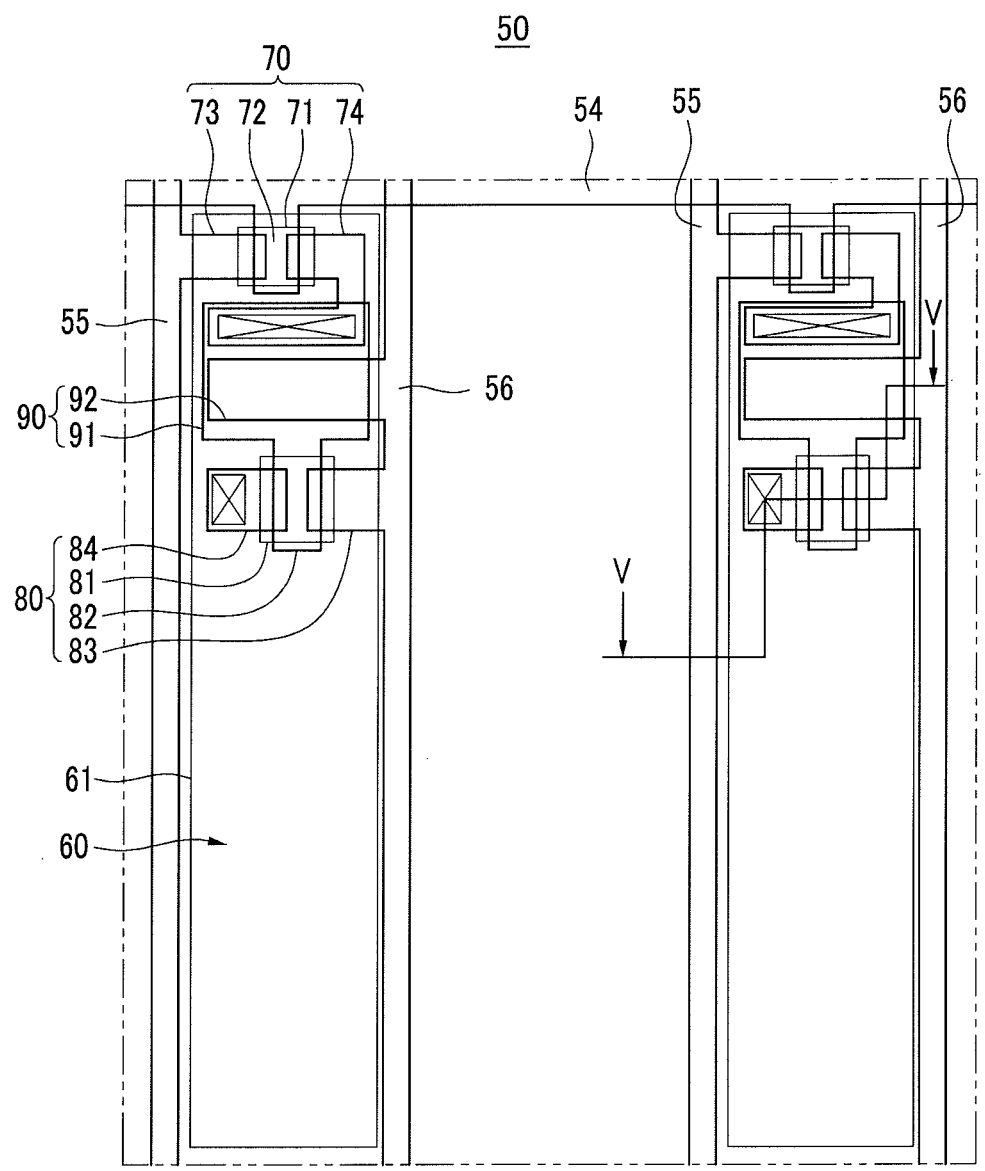
FIG. 4 is a layout view showing pixels of a pixel area of the organic light emitting diode display shown in FIG. 1B.
Figure 5:
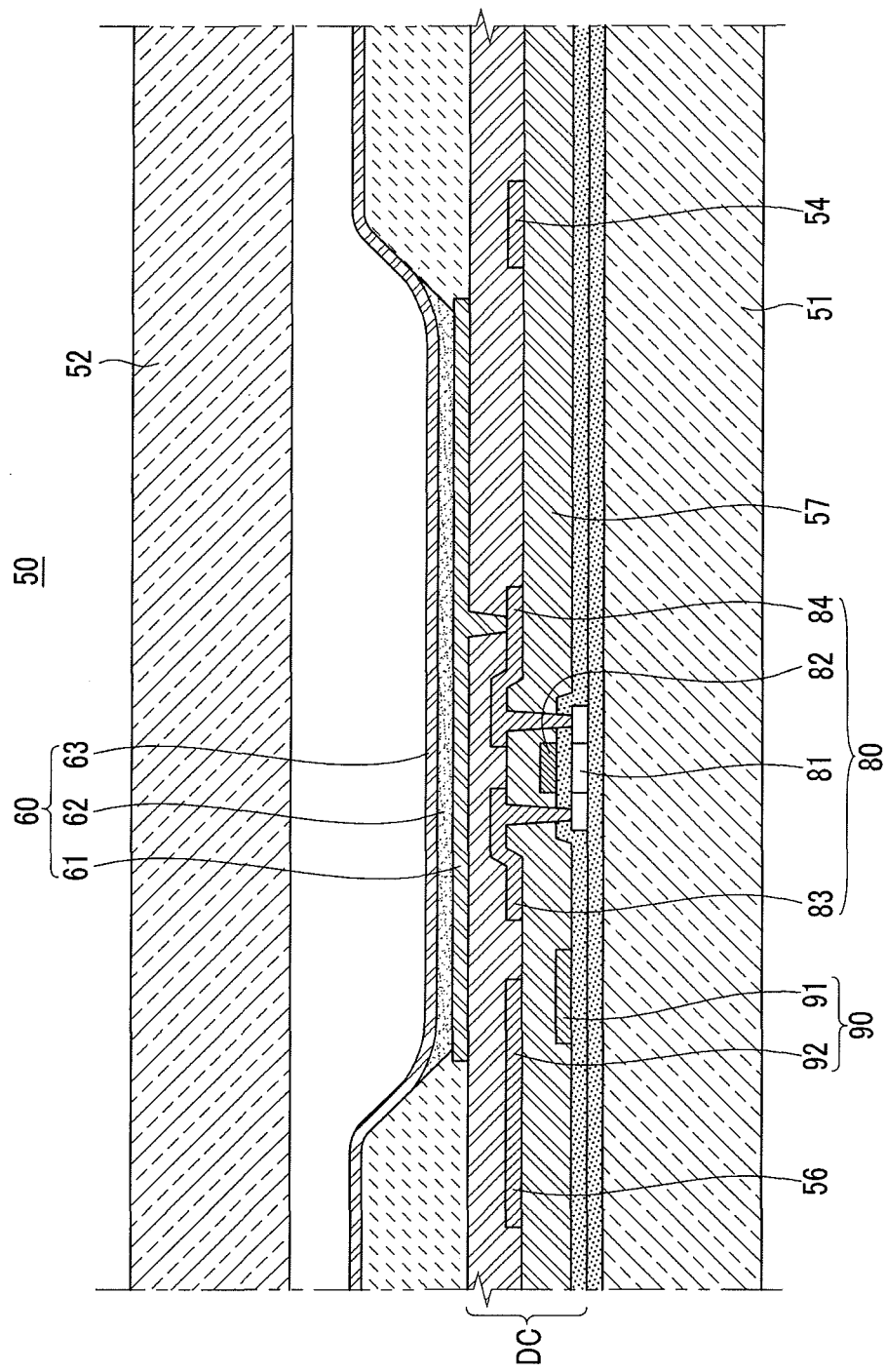
FIG. 5 is a cross-sectional view taken along line V-V of FIG. 4.

Now, the internal structure of the organic light emitting display panel 50 will be described with reference to FIGS. 4 and 5. FIG. 4 is a layout view showing the pixels of the pixel area of the OLED display shown in FIG. 1B, and FIG. 5 is a cross-sectional view taken along line V-V of FIG. 4. In one embodiment, one pixel of the organic light emitting display panel 50 includes three sub-pixels. The three sub-pixels include a first sub-pixel with a red organic emission layer, a second sub-pixel with a green organic emission layer, and a third sub-pixel with a blue organic emission layer.

In one embodiment, as shown in FIGS. 4 and 5, the organic light emitting display panel 50 is an active matrix type in which one sub-pixel includes two thin film transistors and one capacitor (a 2Tr-1 Cap structure). In another embodiment, the organic light emitting display panel 50 may have three or more thin film transistors and two or more capacitors in one sub-pixel, and may have various structures including separate wires.

Referring to FIGS. 4 and 5, each sub-pixel of the organic light emitting display panel 50 includes a driving circuit (DC) and an organic light emitting element 60. The driving circuit (DC) includes a switching thin film transistor 70, a driving thin film transistor 80, and a capacitor element 90. Further, the organic light emitting display panel 50 includes a gate line 54 arranged along one direction, a data line 55 and a common power line 56 insulated from and crossing the gate line 54.

One sub-pixel may be defined by the gate line 54, the data line 55, and the common power line 56, but the present embodiment is not necessarily limited thereto.

The organic light emitting element 60 includes a pixel electrode 61, an organic emission layer 62 formed on the pixel electrode 61, and a common electrode 63 formed on the organic emission layer 62 (see FIG. 5). In this exemplary embodiment, the pixel electrode 61 is formed at least partially of a transparent conductive material, and the common electrode 63 is formed at least partially of a light-reflective metal. Holes and electrons are injected into the organic emission layer 62 from the pixel electrode 61 and the common electrode 63, respectively. The organic emission layer 62 emits light by energy generated when excitons formed by recombinations of the injected holes and electrons drop from an excited state to a ground state. The light emitted from the organic emission layer 62 is reflected toward the pixel electrode 61 by the common electrode 63, and passes through the pixel electrode 61, and the base substrate 51 and is dissipated.

The capacitor element 90 includes a pair of capacitor plates 91 and 92 disposed with an interlayer insulation layer 57 interposed therebetween. In one embodiment, the interlayer insulation layer 57 is formed of a dielectric material. Storage capacity is determined by the electric charges stored in the capacitor 90 and the voltage between the capacitor plates 91 and 92.

The switching thin film transistor 70 includes a switching semiconductor layer 71, a switching gate electrode 72, a switching source electrode 73, and a switching drain electrode 74. The driving thin film transistor 80 includes a driving semiconductor layer 81, a driving gate electrode 82, a driving source electrode 83, and a drain electrode 84.

The switching thin film transistor 70 is used as a switching element to select a sub-pixel to emit light. The switching gate electrode 72 is electrically connected to the gate line 54, and the switching source electrode 73 is electrically connected to the data line 55. The switching drain electrode 74 is spaced apart from the switching source electrode 73 and electrically connected to one of the capacitor plates (91 in this case).

The driving thin film transistor 80 applies a driving power for emitting the organic emission layer 62 of the selected sub-pixel to the pixel electrode 61. The driving gate electrode 82 is electrically connected to the capacitor plate 91 which is electrically connected to the switching drain electrode 74. The driving source electrode 83 and the other capacitor plate 92 are electrically connected to the common power line 56. The driving drain electrode 84 is electrically connected to the pixel electrode 61 of the organic light emitting element 60 via a contact hole.

The switching thin film transistor 70 is driven by a gate voltage applied to the gate line 54, and supplies a data voltage applied to the data line 55 to the driving thin film transistor 80. A voltage corresponding to a difference between the common voltage, which is supplied from the common power line 56 to the driving thin film transistor 80, and the data voltage, which is supplied from the switching thin film transistor 70, is stored in the capacitor element 90. A current corresponding to the voltage stored in the capacitor element 90 flows into the organic light emitting element 60 through the driving thin film transistor 80 to make the organic emission layer 62 emit light.

According to at least one embodiment, the attachment force of the chip on film to the base substrate can be increased, and damage to the chip on film caused by external force and a possible short-circuit of the chip on film can be effectively prevented because the spacer functions as reinforcing means for resisting the external force applied to the chip on film. Moreover, as the spacer is made of a material having high thermal conductivity, the heat generated from the driving integrated circuit can be rapidly dissipated, thereby suppressing overheating of the driving integrated circuit.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
   an organic light emitting display panel including i) a base substrate having a pixel area and a pad area and ii) a protection substrate connected to the base substrate to cover the pixel area, wherein the pad area is foamed outside of the pixel area and adjacent to an edge of the base substrate;
   a printed circuit board formed on the protection substrate;
   a chip on film including i) a first terminal contacting the pad area, ii) a second terminal electrically connected to the printed circuit board and iii) a bending portion bent from the first terminal toward the second terminal; and
   a spacer formed on the first terminal, wherein the spacer is located inside of the bending portion, and wherein the thickness of the spacer is substantially equal to the thickness of the protection substrate,
   wherein the chip on film further comprises a flat portion interconnecting the bending portion and the second terminal, wherein the chip on film further comprises a driving integrated circuit contacting the flat portion,
   wherein the spacer includes a top surface and a bottom surface opposing each other, wherein the top surface of the spacer contacts the driving integrated circuit, and wherein the bottom surface of the spacer contacts the first terminal.

2. The display of claim 1, wherein the sum of the thicknesses of the first terminal, the spacer, and the driving integrated circuit is substantially equal to the sum of the thicknesses of the protection substrate and the printed circuit board.

3. The display of claim 1, wherein the spacer comprises a thermal conductive layer and an adhesive layer formed on one surface of the thermal conductive layer facing the first terminal and on another surface of the thermal conductive layer facing the flat portion.

4. The display of claim 3, wherein the thermal conductive layer has thermal conductivity of greater than about 0.7 W/(mk), and is formed of at least one of the following: a silicon resin, a ceramic, a metal, a metal oxide, and a metal hydride.

5. The display of claim 4, wherein the metal is formed of at least one of the following: aluminum, copper, or an aluminum-copper alloy.

6. The display of claim 3, wherein the adhesive layer is formed of a thermally conductivity acrylic adhesive.

7. The display of claim 1, wherein the thickness of the spacer is substantially equal to the thickness of the protection substrate, and wherein the width of the spacer is greater than or equal to the width of an overlap area of the chip on film and the spacer.

8. The display of claim 1, wherein the organic light emitting display panel comprises organic light emitting elements formed in the pixel area, and wherein each of the organic light emitting elements comprises a transmissive pixel electrode, an organic emission layer formed on the pixel electrode, and a reflective common electrode formed on the organic emission layer.

9. The display of claim 1, wherein the spacer includes two opposing side surfaces, wherein one side surface faces the bending portion, and wherein the other side surface faces a side surface of the protection substrate.

10. The display of claim 9, wherein the protection substrate includes a top surface and a bottom surface opposing each other, wherein the printed circuit board is formed on the top surface of the protection substrate, wherein the bottom surface of the protection substrate is connected to the base substrate via a sealant, and wherein the side surface of the protection substrate is substantially perpendicular to at least one of the top and bottom surfaces of the protection substrate.

11. An organic light emitting diode display, comprising:
a base substrate having a pixel area and a pad area, wherein the pad area is formed outside of the pixel area and adjacent to an edge of the base substrate;
a protection substrate connected to the base substrate to cover the pixel area, wherein the protection substrate does not contact at least part of the pad area;
a printed circuit board formed on the protection substrate;
a chip on film including i) a first terminal electrically connected to the pad area, ii) a second terminal electrically connected to the printed circuit board, iii) a bending portion bent from the first terminal toward the second terminal and iv) a flat portion interconnecting the bending portion and the second terminal, wherein the chip on film further comprises a driving integrated circuit; and
a spacer formed on the first terminal, wherein the spacer is located inside of the bending portion, and wherein the thickness of the spacer is substantially equal to the thickness of the protection substrate,
wherein the spacer includes a top surface and a bottom surface opposing each other, wherein the top surface of the spacer contacts the driving integrated circuit, and wherein the bottom surface of the spacer contacts the first terminal.

12. The display of claim 11, wherein the spacer contacts neither of the bending portion and the protection substrate.

13. The display of claim 11, wherein the spacer is wider and thicker than the driving integrated circuit.

14. The display of claim 11, wherein the spacer comprises a thermal conductive layer and an adhesive layer formed on one surface of the thermal conductive layer facing the first terminal and on another surface of the thermal conductive layer facing the flat portion.

15. The display of claim 14, wherein the thermal conductive layer is substantially thicker than the adhesive layer.

16. The display of claim 11, wherein the width of the spacer is substantially equal to the width of the first terminal and the flat portion, and wherein the spacer is thicker and wider than the driving integrated circuit.

17. An organic light emitting diode display, comprising:
a first substrate having a pixel area and a pad area, wherein the pad area is formed outside of the pixel area;
a second substrate connected to the pixel area of the first substrate, wherein the second substrate has a top surface and a bottom surface opposing each other, and wherein the bottom surface contacts the pixel area;
a printed circuit board formed on the top surface of the second substrate;
a first terminal having first and second surfaces opposing each other, wherein the first surface of the first terminal is electrically connected to the pad area;
a second terminal electrically connected to the printed circuit board;
a non-linear portion non-linearly extending from the first terminal toward the second terminal;
a flat portion interconnecting the non-linear portion and second terminal, wherein the flat portion has first and second surfaces opposing each other, and wherein the first surface of the flat portion faces the first terminal and is substantially directly above the pad area;
a driving integrated circuit formed on the first surface of the flat portion; and
a spacer contacting the second surface of the first terminal and the driving integrated circuit, wherein the spacer comprises i) a thermal conductive layer, ii) a first adhesive layer formed on a first surface of the thermal conductive layer and iii) a second adhesive layer formed on a second surface of the thermal conductive layer, wherein the first adhesive layer contacts the first terminal, wherein the second adhesive layer contacts the driving integrated circuit, and wherein the thickness of the spacer is substantially equal to the thickness of the second substrate,
wherein the first adhesive layer includes a top surface and a bottom surface opposing each other, and wherein the top surface of the first adhesive layer contacts the first surface of the thermal conductive layer.

* * * * *